(12) United States Patent
Lue

(10) Patent No.: US 9,087,736 B1
(45) Date of Patent: Jul. 21, 2015

(54) THREE-DIMENSIONAL MEMORY DEVICE

(71) Applicant: MACRONIX INTERNATIONAL CO., LTD., Hsinchu (TW)

(72) Inventor: Hang-Ting Lue, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/449,305

(22) Filed: Aug. 1, 2014

(51) Int. Cl.
*H01L 23/52* (2006.01)
*H01L 27/115* (2006.01)

(52) U.S. Cl.
CPC ................................ *H01L 27/11551* (2013.01)

(58) Field of Classification Search
CPC ....................... H01L 25/0756; H01L 27/11551
USPC ................................................. 257/211, 278
See application file for complete search history.

(56) References Cited

U.S. PATENT DOCUMENTS

| 7,847,334 | B2 * | 12/2010 | Katsumata et al. | 257/315 |
| 8,068,364 | B2 * | 11/2011 | Maejima | 365/185.11 |
| 8,178,917 | B2 * | 5/2012 | Tanaka et al. | 257/324 |
| 8,503,213 | B2 | 8/2013 | Chen et al. | |
| 2012/0181580 | A1 | 7/2012 | Lue et al. | |

* cited by examiner

*Primary Examiner* — Chandra Chaudhari
(74) *Attorney, Agent, or Firm* — McClure, Qualey & Rodack, LLP

(57) ABSTRACT

A 3D memory device comprising a memory unit block, a first stair-step structure, a second stair-step structure, a first conductive strip and a second conductive strip is provided. The memory unit block comprises a first stacked structure comprising a first semiconductor strip and a second stacked structure comprising a second semiconductor strip. The first stair-step structure is disposed on one side of the memory unit block. The second stair-step structure is disposed on an opposite side of the memory unit block. The first conductive strip electrically coupled to the first semiconductor strip via the first stair-step structure. The second conductive strip electrically coupled to the second semiconductor strip via the second stair-step structure.

20 Claims, 7 Drawing Sheets

THREE-DIMENSIONAL MEMORY DEVICE

TECHNICAL FIELD

The disclosure relates in general to a memory device, and more particularly to a three-dimensional (3D) memory device in which multiple planes of memory cells are arranged.

BACKGROUND

With advances in the integrated circuit manufacturing technology, 3D memory devices with multiple planes of memory cells are provided to achieve greater storage capacity.

In a 3D memory array, bit lines are configured to access the various layers of the memory array, so the configuration of the bit lines significantly affects the read and/or program speed of memory. Therefore, there is a need for a memory device capable of improving the bandwidth of read and/or program operation.

SUMMARY

The disclosure is directed to a 3D memory device. The conductive structures of the 3D memory device are arranged to improve the bandwidth of read and programming.

According to one embodiment, a 3D memory device is provided. The 3D memory device comprises a memory unit block, a first stair-step structure, a second stair-step structure, a first conductive strip and a second conductive strip. The memory unit block comprises a first stacked structure comprising a first semiconductor strip and a second stacked structure comprising a second semiconductor strip, wherein the second stacked structure is parallel and adjacent to the first stacked structure. The first stair-step structure is disposed on one side of the memory unit block, wherein one end of the first semiconductor strip is connected to the first stair-step structure. The second stair-step structure is disposed on an opposite side of the memory unit block, wherein one end of the second semiconductor strip is connected to the second stair-step structure. The first conductive strip electrically coupled to the first semiconductor strip via the first stair-step structure. The second conductive strip electrically coupled to the second semiconductor strip via the second stair-step structure.

The above and other aspects of the disclosure will become better understood with regard to the following detailed description of the non-limiting embodiment(s). The following description is made with reference to the accompanying drawings.

Figure 1:
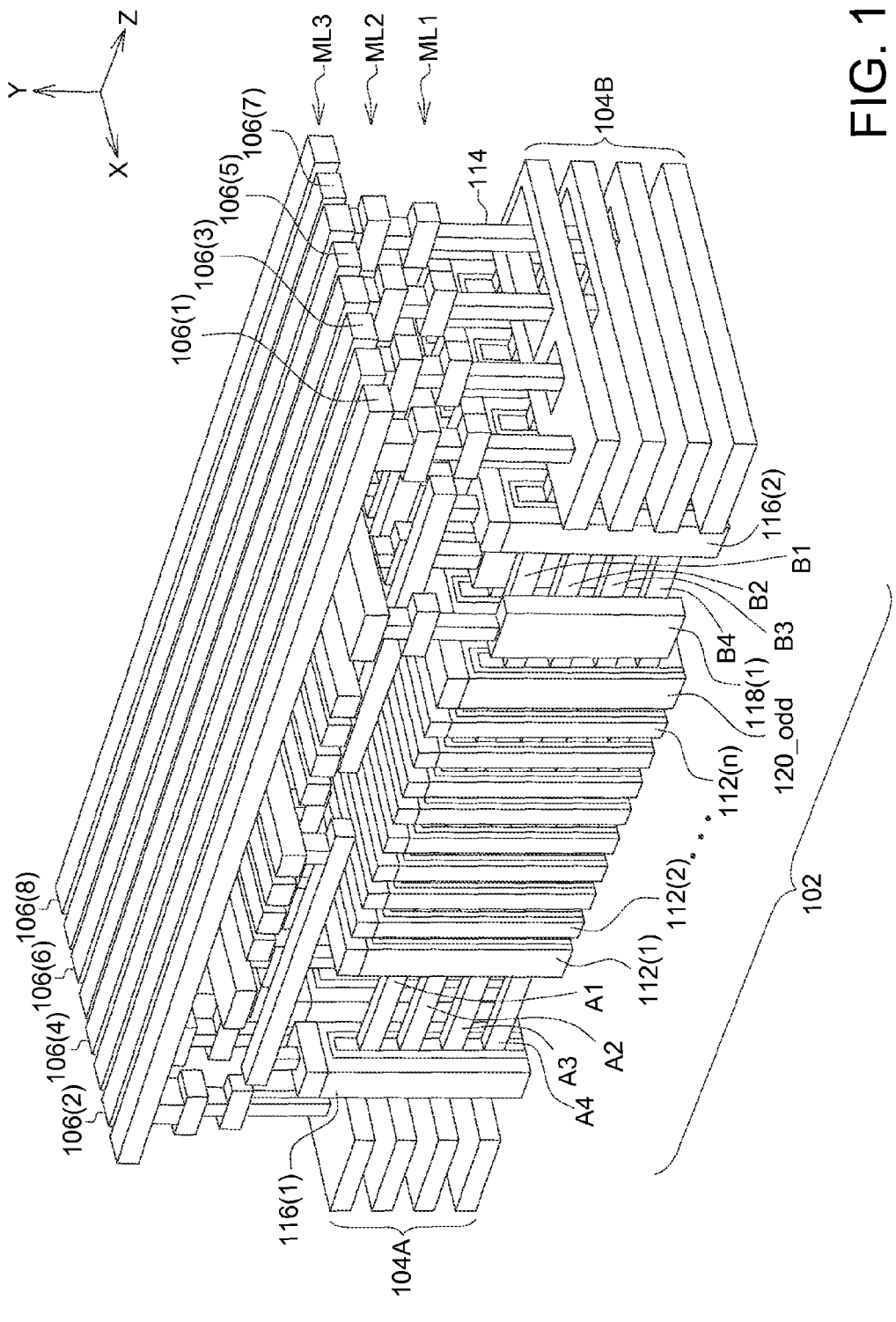
FIG. 1 illustrates a schematic diagram of a 3D memory device according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
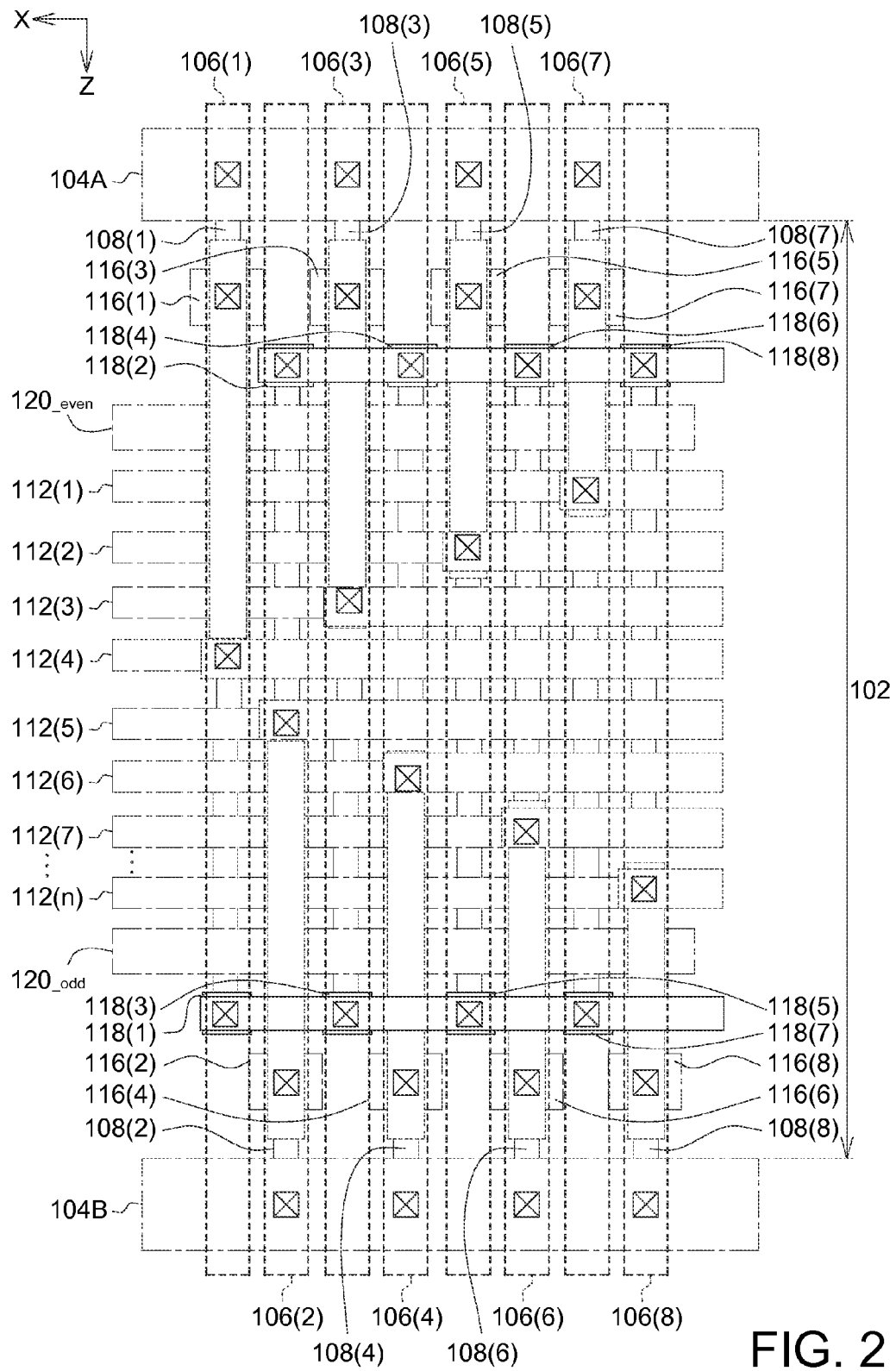
FIG. 2 illustrates a top view of the 3D memory device.

FIG. 1 illustrates a schematic diagram of a 3D memory device 100 according to an embodiment of the present invention. FIG. 2 illustrates a top view of the 3D memory device 100. The 3D memory device 100 comprises a memory unit block 102, stair-step structures 104A and 104B, and multiple conductive strips 106(1)-106(8). A plurality of memory cells are defined in the memory unit block 102. Each conductive strip 106(1)-106(8) may be, for example, functioned as a bit line (BL) of a memory cell string.

The memory unit block 102 comprises multiple columns of stacked structures 108(1)-108(8) extending along X direction. Odd columns of stacked structures 108(1), 108(3), 108(5) and 108(7) and even columns of stacked structures 108(2), 108(4), 108(6) and 108(8) are disposed alternately. The stacked structure 108(1) is parallel and adjacent to the stacked structure 108(2). The stacked structure 108(3) is parallel and adjacent to the stacked structure 108(4). The stacked structure 108(5) is parallel and adjacent to the stacked structure 108(6). The stacked structure 108(7) is parallel and adjacent to the stacked structure 108(8). Each stacked structure 108(1)-108(8) comprises multiple semiconductor strips (ex., semiconductor strips A1-A4 of the stacked structure 108(1) or semiconductor strips B1-B4 of the stacked structure 108(2)) separated from each other. As shown in FIG. 1, the semiconductor strips A1-A4 are disposed on different layers and separated by dielectric strips. The semiconductor strips B1-B4 are disposed on different layers and separated by dielectric strips. FIG. 1 does not show portions of the dielectric strips between the semiconductor strips for the sake of brevity of the memory device of one embodiment.

Conductive layers 112(1)-112(n) disposed along Z direction are separated from each other and disposed on the sidewall of the stacked structures 108(1)-108(8), where n is an integral larger than 1. The conductive layers 112(1)-112(n) may be, for example, functioned as word lines (WLs) of the 3D memory device 100.

The stair-step structure 104A is disposed on one side of the memory unit block 102. One end of a semiconductor strip of the odd columns of the stacked structures 108(1), 108(3), 108(5) and 108(7) is connected to the stair-step structure 104A. The stair-step structure 104B is disposed on the opposite side of the memory unit block 102. One end of a semiconductor strip of the even columns of the stacked structures 108(2), 108(4), 108(6) and 108(8) is connected to the stair-step structure 104B.

The conductive strips 106(1), 106(3), 106(5) and 106(7) and the conductive strips 106(2), 106(4), 106(6) and 106(8) are disposed alternately. The conductive strips 106(1), 106(3), 106(5) and 106(7) are connected to the semiconductor strips of the odd columns of the stacked structures 108(1), 108(3), 108(5) and 108(7) via the stair-step structure 104A. In the example of FIG. 1, the conductive strips 106(1), 106(3), 106(5) and 106(7) are disposed on a third metal layer ML3 above the stacked structures 108(1)-108(8) and are respectively connected to different layers of the stair-step structure 104A via the conductive plugs 114 to electrically connect to different layers of the semiconductor strips of the stacked structure 108(1), 108(3), 108(5) and 108(7). Likewise, the conductive strips 106(2), 106(4), 106(6) and 106(8) are disposed on the third metal layer ML3 and are respectively connected to different layers of the semiconductor strips of stacked structure 108(2), 108(4), 108(6) and 108(8) via the stair-step structure 104B.

In the example of FIG. 1, the conductive strips 106(1)-106(8) are parallel to the semiconductor strips of each stacked structures 108(1)-108(8). The conductive strips 106(1), 106(3), 106(5) and 106(7) are across the top of the memory unit block 102 and the stair-step structure 104B, and are electrically isolated from the stair-step structure 104B. The conductive strips 106(2), 106(4), 106(6) and 106(8) are across the top of the memory unit block 102 and the stair-step structure 104A, and are electrically isolated from the stair-step structure 104A. The pitch between two adjacent semiconductor strips on the same layer (ex., the semiconductor strip A1 of the stacked structure 108(1) and the semiconductor strip B1 of 108(2) on the same layer) is equal to the pitch between the two adjacent conductive strips (ex., conductive strips 106(1) and 106(2)). Compared with conventional 3D memory structure, the 3D memory device according to the embodiment of the invention can provide larger bandwidth of read and programming.

In the example of FIG. 1, conductive structures 116(1), 116(3), 116(5) and 116(7) are respectively disposed on the sidewall of the semiconductor strips of the stacked structures 108(1), 108(3), 108(5) and 108(7) and are adjacent to the stair-step structure 104A. The conductive structures 116(1), 116(3), 116(5) and 116(7) are functioned as string select lines for the stacked structures of the odd columns. Likewise, conductive structures 116(2), 116(4), 116(6) and 116(8) are respectively disposed on the sidewall of the semiconductor strips of the stacked structures 108(2), 108(4), 108(6) and 108(8) and are adjacent to the stair-step structure 104B. The conductive structures 116(2), 116(4), 116(6) and 116(8) are functioned as string select lines for the stacked structures of the even columns. In other words, the string select line gates of the 3D memory device 100 are disposed in reverse direction for even and odd pages.

Conductive structures 116(1)-116(8) are electrically connected to the string select lines formed by the first and second metal layers ML1 and ML2. By proving voltages to the string select lines formed by the first and second metal layers ML1 and ML2, the semiconductor strip of the corresponding stacked structure can be controlled to be in a selected state (or "on" state) or an unselected state (or "off" state).

Conductive structures 118(1), 118(3), 118(5) and 118(7) are respectively disposed on the sidewall of the semiconductor strips of the odd stacked structures 108(1), 108(3), 108(5) and 108(7) and are adjacent to the stair-step structure 104B. The conductive structures 118(1), 118(3), 118(5) and 118(7) are functioned as source lines for the stacked structures of the odd columns, and terminate the semiconductor strips of the stacked structures 108(1), 108(3), 108(5) and 108(7). Likewise, conductive structures 118(2), 118(4), 118(6) and 118(8) are respectively disposed on the sidewall of the semiconductor strips of the even stacked structures 108(2), 108(4), 108(6) and 108(8) and are adjacent to the stair-step structure 104A. The conductive structures 118(2), 118(4), 118(6) and 118(8) are functioned as source lines for the stacked structures of the even columns, and terminate the semiconductor strips of the stacked structures 108(2), 108(4), 108(6) and 108(8).

Conductive structures $120^-_{odd}$ are respectively disposed on the sidewall of the semiconductor strips of the odd stacked structures 108(1), 108(3), 108(5) and 108(7) and are functioned as ground select lines for the stacked structures of the odd columns. Likewise, conductive structures $120^-_{even}$ are respectively disposed on the sidewall of the semiconductor strips of the even stacked structures 108(2), 108(4), 108(6) and 108(8) and are functioned as ground select lines for the stacked structures of the even columns. In the embodiment, a conductive structure functioned as a ground select line is located between a conductive structure functioned as a string select line and a conductive structure functioned as a source line, and is adjacent to the conductive structure functioned as the source line.

It is understood that in embodiments, quantity of the conductive strip, column of the stacked structure, row of the word line is not limited to that shown in FIG. 1, and may be more or less according to actual demands. Moreover, in embodiments, a conductive material used may comprise a metal, a polysilicon, a metal silicide, or other suitable materials. A dielectric material used may comprise an oxide, or a nitride, such as silicon oxide, silicon nitride or silicon oxynitride, or other suitable materials.

Figure 3:
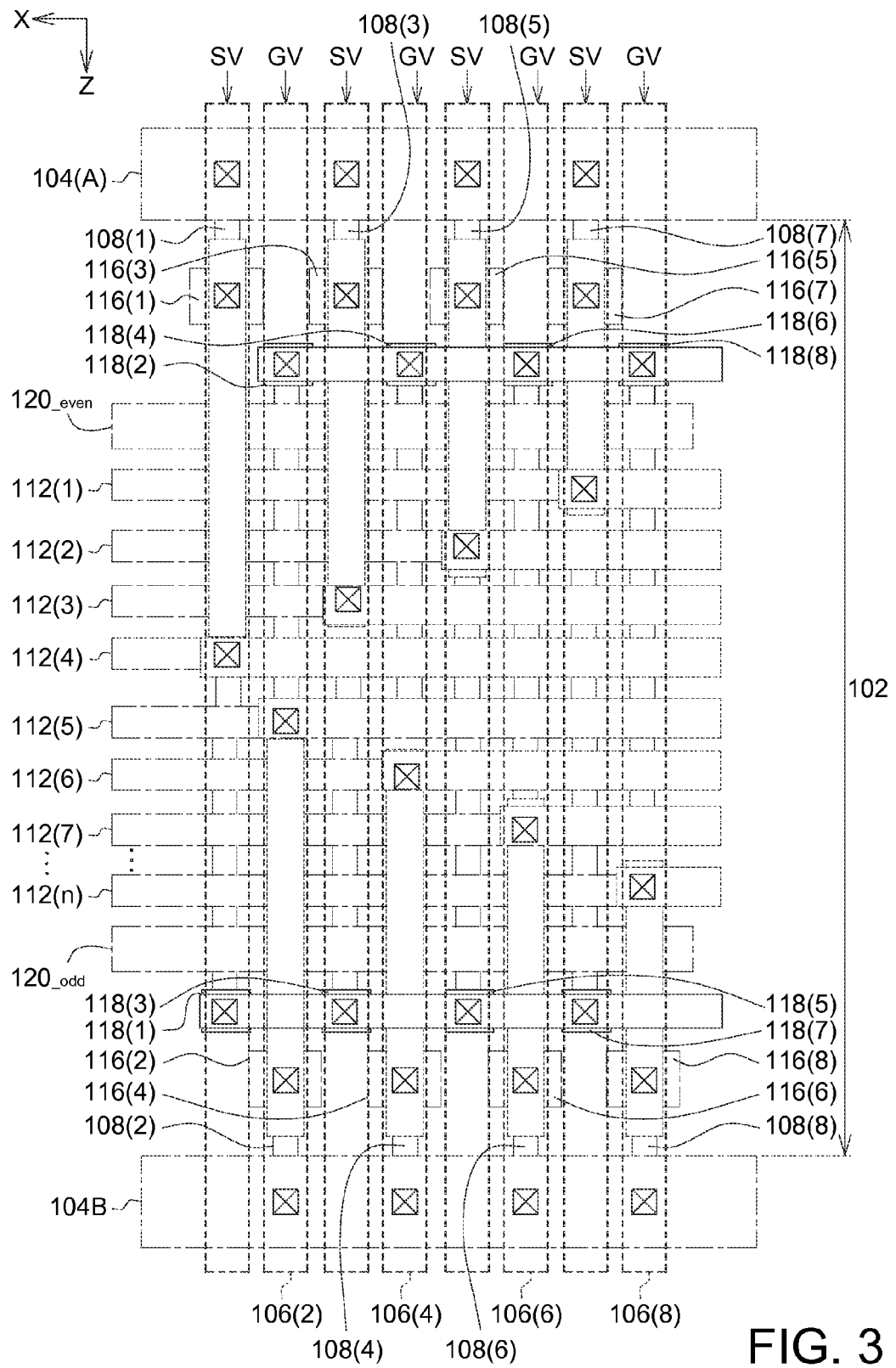
FIG. 3 illustrates an example of a read operation of the 3D memory device.

FIG. 3 illustrates an example of a read operation of the 3D memory device 100. In the example of FIG. 3, an odd page is selected first. K layers (ex., K=4) of memory cells of the memory device 100 are sensed by applying sensing signals SV on the conductive strips 106(1), 106(3), 106(5) and 106(7) functioned as bit lines. Shielding signals GV (ex., ground voltage) are applied on the conductive strips 106(2), 106(4), 106(6) and 106(8) to shield them. Then, an even page is selected and turned on. In the embodiment, the sensing operation can be embedded within a word line setup waveform. Thus, two pages are essentially read in the waveform, so that the bandwidth of read and programming is doubled.

Figure 4:
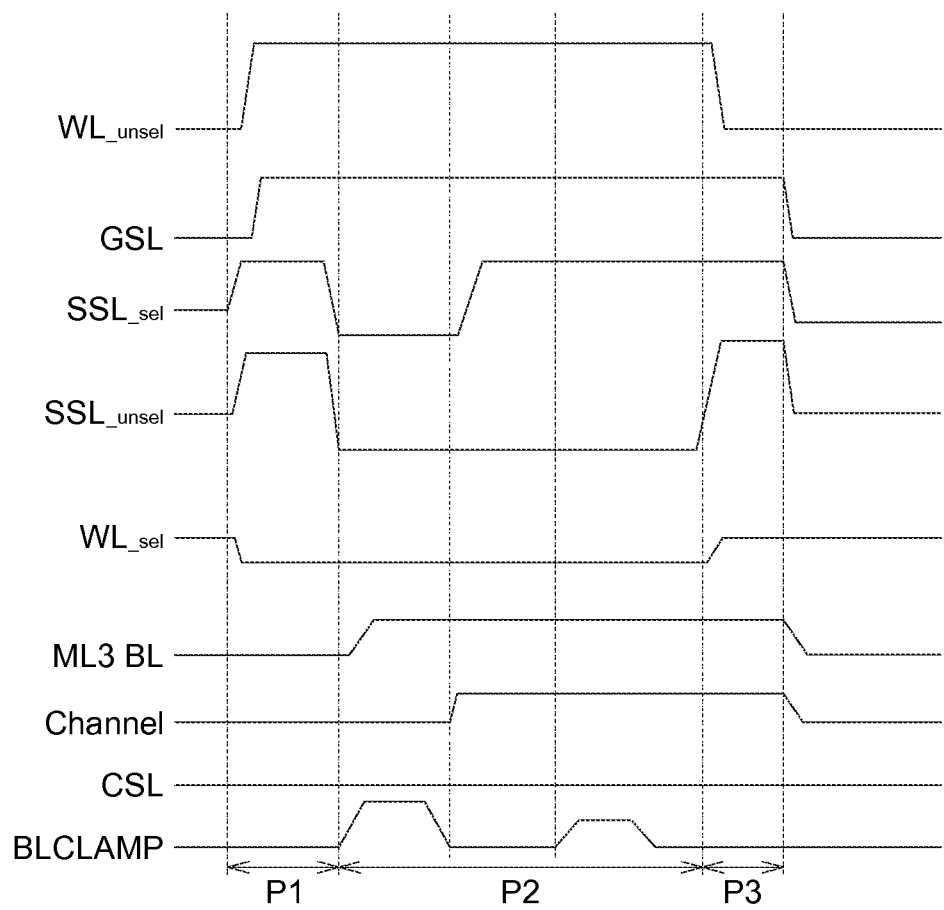
FIG. 4 illustrates waveforms of signals for reading the 3D memory device.

FIG. 4 illustrates waveforms of signals for reading the 3D memory device 100. In a pre-charging phase P1, the ground select line signal (GSL) is set to a high voltage (ex., about 6V) and the source line signal (CSL) is set to a ground voltage. The selected string select line signal ($SSL^-_{sel}$) and the un-selected string select line signal ($SSL^-_{unsel}$) are set to a high voltage to set the voltage of the memory cell channel voltage (Channel) as a ground level. In a setup and sensing phase P2, the selected string select line signal ($SSL^-_{sel}$) is set to a pass voltage about 6V, the un-selected string select line signal ($SSL^-_{unsel}$) is set to a low voltage about −2V, the bit line of the third metal layer signal (ML3 BL) is set to a sensing voltage about 1V, the un-selected word line signal ($WL^-_{unsel}$) is set to a pass voltage about 6V, and the selected word line signal ($WL^-_{sel}$) is set to a low voltage about 0V. By applying a bit line clamp signal (BLCAMP), data stored in the cells can be sensed by a sensing circuit. The setup and sensing phase repeats for the read of the two pages. In a recovery phase P3, the memory cell channel discharges to ground for recovery. It is understood that the signal waveforms shown in FIG. 4 is just one way of implementing the present invention. It is given for illustration purposes, not for restriction purposes.

Figure 5:
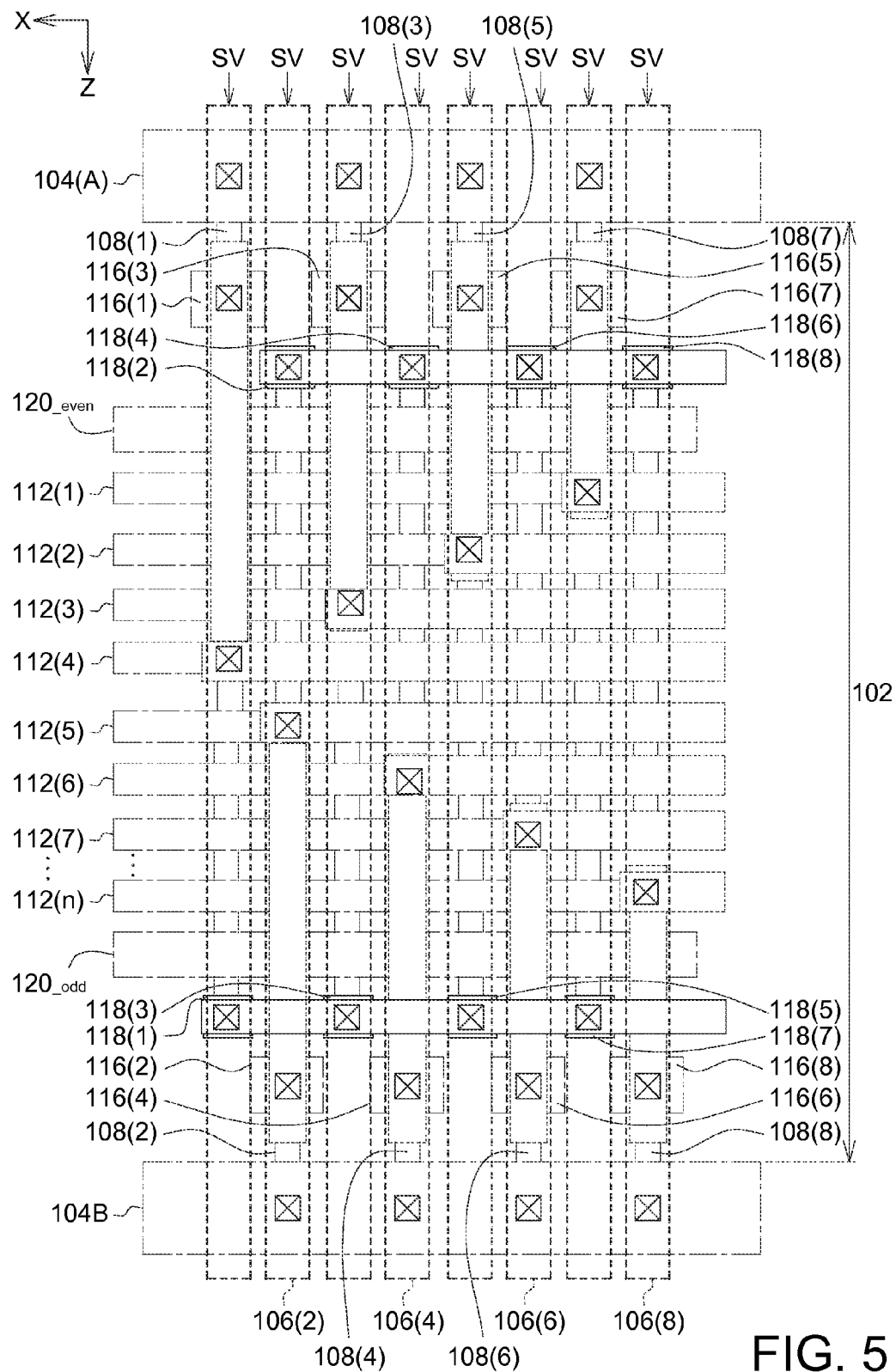
FIG. 5 illustrates another example of a read operation of the 3D memory device.

FIG. 5 illustrates another example of a read operation of the 3D memory device 100. In the example of FIG. 5, two pages are selected simultaneously, wherein one in odd page, and the other in the even page. To double the read speed, word lines and ground select lines are setup, and all un-selected string select lines are turned-off.

Figure 6:
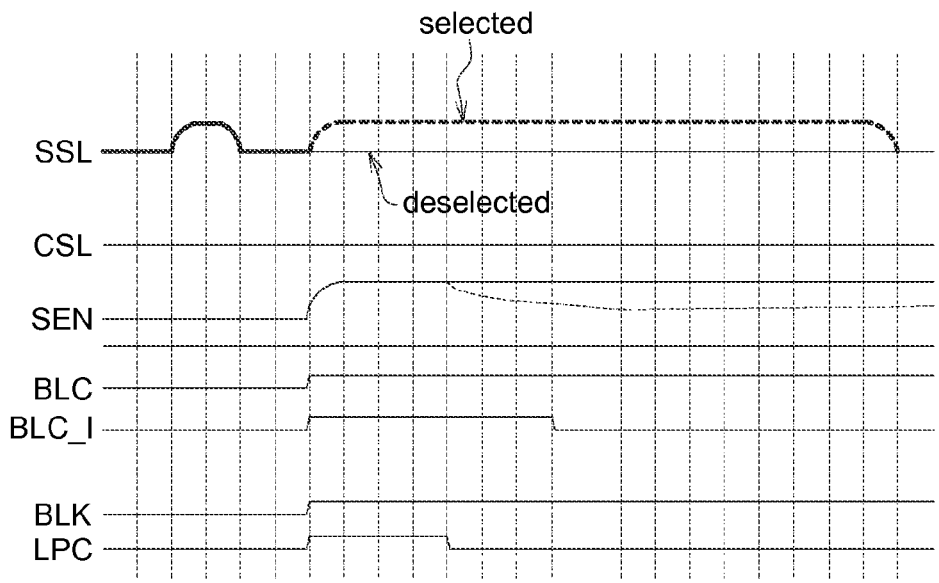
FIG. 6 illustrates a sensing amplifier for reading the 3D memory device.
Figure 7:
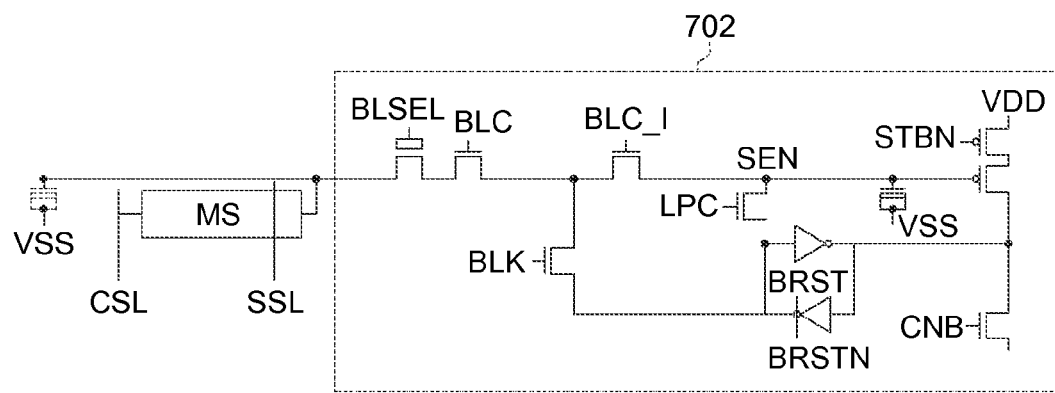
FIG. 7 illustrates signal waveforms related to the sensing amplifier for the read operation.

FIG. 6 illustrates a sensing amplifier 702 for reading the 3D memory device 100. FIG. 7 illustrates signal waveforms related to the sensing amplifier 702 for the read operation. As shown in FIG. 7, the signals related to the sensing amplifier 702 includes signals CSL, SSL, BLSEL, BLC, BLK, BLC_I, LPC, BRST, BRSTN, STBN and CNB. The sensing amplifier 702 can perform conventional memory sensing operation by using the abovementioned signals, so detail description of operations of the sensing amplifier 702 is omitted. For a memory cell string MS of the 3D memory device 100, current sensing is performed by the sensing amplifier 702 to read data stored in a particular memory cell.

Figure 8:
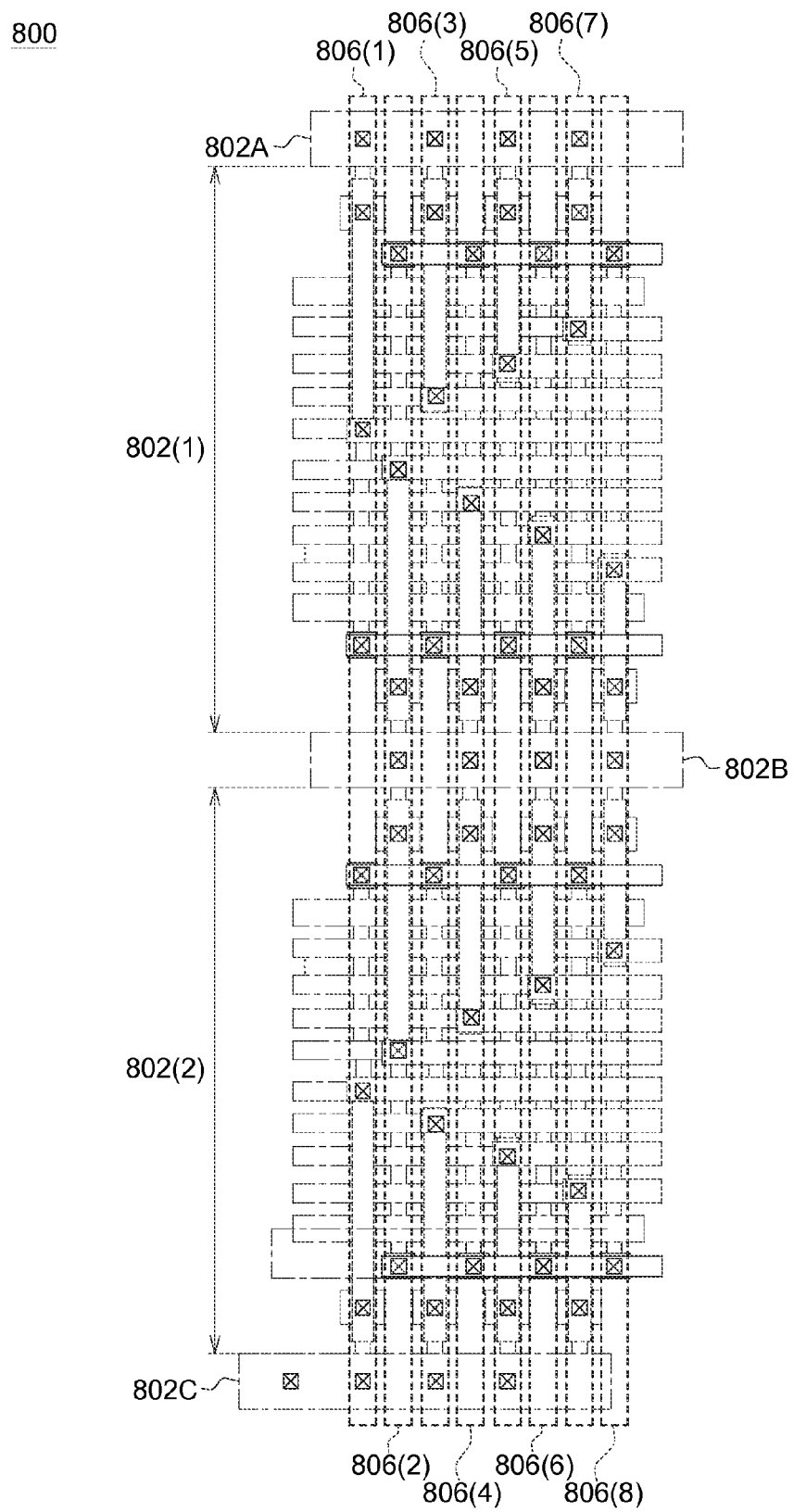
FIG. 8 illustrates a top view of a 3D memory device according to an embodiment of the present invention.

FIG. 8 illustrates a top view of a 3D memory device 800 according to an embodiment of the present invention. The 3D memory device 800 comprises a plurality of memory unit blocks 802A and 802B. The memory unit blocks 802A and 802B and a plurality of stair-step structures 804A, 804B and 804C are disposed alternately. The stacked structures in the memory unit blocks 802A and 802B are the same with the stacked structures shown in FIG. 1, so detailed description about the stacked structures 802A and 802B is omitted herein. Conductive strips 806(1)-806(8) are parallel to the stacked structures in the memory unit blocks 802A and 802B. Conductive strips 806(1), 806(3), 806(5) and 806(7) are electrically connected to the stair-step structures 804A and 804C via conductive plugs, and are electrically isolated from the stair-step structure 804B (i.e., does not connect to the stair-step structure 804B). Conductive strips 806(2), 806(4), 806(6) and 806(8) are electrically connected to the stair-step structure 804B via conductive plugs, and are electrically isolated from the stair-step structures 804A and 804C (i.e., does not connect to the stair-step structures 804A and 804C). In other words, the conductive strips 806(1), 806(3), 806(5) and 806(7) are electrically connected to the stair-step structures of odd rows. The conductive strips 806(2), 806(4), 806(6) and 806(8) are electrically connected to the stair-step structures of even rows. In the embodiment, the location of each stair-step structure 804A-804C can be shifted along X direction. For example, a shift-scramble design can be used to average the bit line capacitance of the 3D memory device 800.

Based on the above, the 3D memory device according to the embodiment of the invention provides a tight-pitch bit line design. Since the number of bit line is increased, the bandwidth of read and programming can be improved compared with the conventional 3D memory device design.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A three-dimensional (3D) memory device, comprising:
   a memory unit block, comprising:
      a first stacked structure comprising a first semiconductor strip; and
      a second stacked structure comprising a second semiconductor strip, wherein the second stacked structure is parallel and adjacent to the first stacked structure;
   a first stair-step structure disposed on one side of the memory unit block, wherein one end of the first semiconductor strip is connected to the first stair-step structure;
   a second stair-step structure disposed on an opposite side of the memory unit block, wherein one end of the second semiconductor strip is connected to the second stair-step structure;
   a first conductive strip electrically coupled to the first semiconductor strip via the first stair-step structure; and
   a second conductive strip electrically coupled to the second semiconductor strip via the second stair-step structure.

2. The 3D memory device according to claim 1, wherein the memory unit block comprises:
   a plurality of the first stacked structures, each comprising a plurality of the first semiconductor strips separated from each other; and
   a plurality of the second stacked structures, each comprising a plurality of the second semiconductor strips separated from each other, wherein the first and second stacked structures are disposed alternately.

3. The 3D memory device according to claim 2, wherein the first stair-step structure is connected to different layers of the first semiconductor strips, and the second stair-step structure is connected to different layers of the second semiconductor strips.

4. The 3D memory device according to claim 3, further comprising:
   a plurality of the first conductive strips respectively connected to different layers of the first semiconductor strips via the first stair-step structure; and
   a plurality of the second conductive strips respectively connected to different layers of the second semiconductor strips via the second stair-step structure, wherein the first and second conductive strips are disposed alternately.

5. The 3D memory device according to claim 1, wherein the first conductive strip is across the top of the memory unit block and the second stair-step structure, and is electrically isolated from the second stair-step structure;
   the second conductive strip is across the top of the memory unit block and the first stair-step structure, and is electrically isolated from the first stair-step structure.

6. The 3D memory device according to claim 1, wherein the pitch between the first and second semiconductor strips is equal to the pitch between the first and second conductive strips.

7. The 3D memory device according to claim 1, wherein the first and second conductive strips extend along a direction parallel to the first and second semiconductor strips.

8. The 3D memory device according to claim 1, wherein the memory unit block further comprise:
   a first conductive structure disposed on a sidewall of the first semiconductor strip at a first position, functioned as a string select line for the first semiconductor strip;
   a second conductive structure disposed on the sidewall of the first semiconductor strip at a second position, functioned as a source line for the first semiconductor strip; and
   a third conductive structure disposed on the sidewall of the first semiconductor strip at a third position, functioned as a ground select line for the first semiconductor strip;
   wherein the first and second positions are adjacent to the first and second stair-step structures, respectively, and the third position is located between the first and second positions and is adjacent to the second position.

9. The 3D memory device according to claim 8, wherein the memory unit block further comprise:
   a fourth conductive structure disposed on a sidewall of the second semiconductor strip at a fourth position, functioned as a string select line for the second semiconductor strip;

a fifth conductive structure disposed on the sidewall of the second semiconductor strip at a fifth position, functioned as a source line for the second semiconductor strip; and a sixth conductive structure disposed on the sidewall of the second semiconductor strip at a sixth position, functioned as a ground select line for the second semiconductor strip;

wherein the fourth and fifth positions are adjacent to the second and first stair-step structures, respectively, and the sixth position is located between the fourth and fifth positions and is adjacent to the fifth position.

10. The 3D memory device according to claim 1, wherein a plurality of memory cells are formed in the first and second semiconductors, wherein the first conductive strip is functioned as a bit line of the memory cells of the first semiconductor strip, and the second conductive strip is functioned as a bit line of the memory cells of the second semiconductor strip.

11. A three-dimensional (3D) memory device, comprising:
a plurality of memory unit blocks, wherein a first memory unit block of the memory unit blocks comprises:
a first stacked structure comprising a first semiconductor strip; and
a second stacked structure comprising a second semiconductor strip, wherein the second stacked structure is parallel and adjacent to the first stacked structure;
a plurality of stair-step structures disposed alternately with the memory unit blocks;
a first conductive strip electrically coupled to the first semiconductor strip via a first stair-step structure of the stair-step structures, wherein the first conductive strip is electrically connected to the stair-step structures of odd rows;
a second conductive strip electrically coupled to the second semiconductor strip via a second stair-step structure of the stair-step structures, wherein the second conductive strip is electrically connected to the stair-step structures of even rows.

12. The 3D memory device according to claim 11, wherein the first memory unit block comprises:
a plurality of the first stacked structures, each comprising a plurality of the first semiconductor strips separated from each other; and
a plurality of the second stacked structures, each comprising a plurality of the second semiconductor strips separated from each other, wherein the first and second stacked structures are disposed alternately.

13. The 3D memory device according to claim 12, wherein the first stair-step structure is connected to different layers of the first semiconductor strips, and the second stair-step structure is connected to different layers of the second semiconductor strips.

14. The 3D memory device according to claim 13, further comprising:
a plurality of the first conductive strips respectively connected to different layers of the first semiconductor strips via the first stair-step structure; and a plurality of the second conductive strips respectively connected to different layers of the second semiconductor strips via the second stair-step structure, wherein the first and second conductive strips are disposed alternately.

15. The 3D memory device according to claim 11, wherein the first conductive strip is electrically isolated from the stair-step structures of even rows, and the second conductive strip is electrically isolated from the stair-step structures of odd rows.

16. The 3D memory device according to claim 11, wherein the pitch between the first and second semiconductor strips is equal to the pitch between the first and second conductive strips.

17. The 3D memory device according to claim 11, wherein the first and second conductive strips extend along a direction parallel to the first and second semiconductor strips.

18. The 3D memory device according to claim 11, wherein the first memory unit block further comprise:
a first conductive structure disposed on a sidewall of the first semiconductor strip at a first position, functioned as a string select line for the first semiconductor strip;
a second conductive structure disposed on the sidewall of the first semiconductor strip at a second position, functioned as a source line for the first semiconductor strip; and
a third conductive structure disposed on the sidewall of the first semiconductor strip at a third position, functioned as a ground select line for the first semiconductor strip;
wherein the first and second positions are adjacent to the first and second stair-step structures, respectively, and the third position is located between the first and second positions and is adjacent to the second position.

19. The 3D memory device according to claim 18, wherein the first memory unit block further comprise:
a fourth conductive structure disposed on a sidewall of the second semiconductor strip at a fourth position, functioned as a string select line for the second semiconductor strip;
a fifth conductive structure disposed on the sidewall of the second semiconductor strip at a fifth position, functioned as a source line for the second semiconductor strip; and
a sixth conductive structure disposed on the sidewall of the second semiconductor strip at a sixth position, functioned as a ground select line for the second semiconductor strip;
wherein the fourth and fifth positions are adjacent to the second and first stair-step structures, respectively, and the sixth position is located between the fourth and fifth positions and is adjacent to the fifth position.

20. The 3D memory device according to claim 11, wherein a plurality of memory cells are formed in the first and second semiconductors, wherein the first conductive strip is functioned as a bit line of the memory cells of the first semiconductor strip, and the second conductive strip is functioned as a bit line of the memory cells of the second semiconductor strip.

\* \* \* \* \*